United States Patent
Burney

(10) Patent No.: US 7,590,211 B1
(45) Date of Patent: Sep. 15, 2009

(54) PROGRAMMABLE LOGIC DEVICE INTEGRATED CIRCUIT WITH COMMUNICATIONS CHANNELS HAVING SHARING PHASE-LOCKED-LOOP CIRCUITRY

(75) Inventor: Ali Burney, Fremont, CA (US)

(73) Assignee: Altera Corporation, San Jose, CA (US)

( * ) Notice: Subject to any disclaimer, the term of this patent is extended or adjusted under 35 U.S.C. 154(b) by 591 days.

(21) Appl. No.: 11/488,286

(22) Filed: Jul. 17, 2006

Related U.S. Application Data

(60) Provisional application No. 60/790,281, filed on Apr. 7, 2006.

(51) Int. Cl.
*H03D 3/24* (2006.01)
(52) U.S. Cl. .................................... 375/376
(58) Field of Classification Search ................. 375/376
See application file for complete search history.

(56) References Cited

U.S. PATENT DOCUMENTS

| | | | |
|---|---|---|---|
| 6,950,956 B2* | 9/2005 | Zerbe et al. ............. | 713/400 |
| 6,985,096 B1 | 1/2006 | Sasaki et al. | |
| 7,003,423 B1 | 2/2006 | Kabani et al. | |
| 7,034,597 B1* | 4/2006 | Mo et al. ............. | 327/276 |
| 7,075,365 B1 | 7/2006 | Starr et al. | |
| 7,340,021 B1* | 3/2008 | Churchill et al. ........... | 375/354 |
| 7,366,270 B2* | 4/2008 | Tang et al. .............. | 375/372 |
| 7,499,513 B1* | 3/2009 | Tetzlaff et al. ............. | 375/358 |
| 2001/0033188 A1 | 10/2001 | Aung et al. | |
| 2004/0258410 A1* | 12/2004 | Yajima et al. ............. | 398/71 |
| 2005/0117517 A1* | 6/2005 | DeCusatis et al. ......... | 370/235 |
| 2006/0250882 A1* | 11/2006 | Choi et al. .............. | 365/233 |
| 2006/0256909 A1* | 11/2006 | On et al. ............... | 375/376 |

OTHER PUBLICATIONS

Baetoniu, "High Speed Data Recovery Using Asynchronous Data Capture Techniques", XAPP671, Jan. 7, 2005, pp. 1-12, (v1.1), Xilinx.*
Yeoh, "Dynamic Phase Alignment for Networking Applications", XAPP700, Dec. 7, 2004, pp. 1-15, (v1.1), Xilinx.*
Baetoniu, "Dynamic Phase Alignment Using Asynchronous Data Capture", XAPP 697 (v1.2) Jan. 7, 2005, Xilinx.*

(Continued)

*Primary Examiner*—Juan A Torres
(74) *Attorney, Agent, or Firm*—Treyz Law Group; G. Victor Treyz; David C. Kellogg

(57) ABSTRACT

Integrated circuits such as programmable logic device integrated circuits are provided that have resource-efficient receiver circuitry. In source-synchronous system environments, an integrated circuit receives data on multiple buses, each of which has a reference clock signal and associated data signals. One of the reference clocks is provided to a phase-locked-loop circuit, which generates a serial clock and parallel clock for capturing and deserializing data for one of the buses. Each additional bus has an associated phase detector and delay-locked loop in place of a phase-locked loop. The phase detector and delay-locked loop in each additional bus shift the serial clock from the phase-locked loop to produce a serial clock for the additional bus. A parallel clock for each additional bus may be produced using a divider.

20 Claims, 7 Drawing Sheets

OTHER PUBLICATIONS

Efendovich, "Multifrequency zero-jitter delay-locked loop", IEEE Journal of Solid-State Circuits, vol. 29, Issue 1, Jan. 1994 pp. 67-70.*

"Stratix II GX Transceiver Block Overview" Stratix II GX Device Handbook, vol. 2, pp. 1-1 to 1-8, Altera Corporation, Feb. 2006.

"Stratix II BX Physical Coding Sub-Layer", pp. 1-3 printed from www.altera.com on Mar. 21, 2006, Altera Corporation.

"Stratix II GX Transceiver FPGAs Physical Medium Attachment Layer", pp. 1 and 2, printed from www.altera.com on Mar. 21, 2006, Altera Corporation.

"Source Synchronous Signaling in Stratix II Devices", pp. 1 and 2, printed from www.altera.com on Mar. 21, 2006, Altera Corporation.

* cited by examiner

PROGRAMMABLE LOGIC DEVICE INTEGRATED CIRCUIT WITH COMMUNICATIONS CHANNELS HAVING SHARING PHASE-LOCKED-LOOP CIRCUITRY

This application claims the benefit of provisional patent application No. 60/790,281, filed Apr. 7, 2006, which is hereby incorporated by reference herein in its entirety.

BACKGROUND

This invention relates to integrated circuits such as programmable logic device integrated circuits, and more particularly, to programmable logic device integrated circuits with resource-efficient transceiver circuitry.

Programmable logic devices are a type of integrated circuit that can be programmed by a user to implement a desired custom logic function. In a typical scenario, a logic designer uses computer-aided design tools to design a custom logic circuit. When the design process is complete, the tools generate configuration data. The configuration data is loaded into a programmable logic device to configure the device to perform the functions of the custom logic circuit.

In a typical system, a programmable logic device integrated circuit and other integrated circuits are mounted on circuit boards. Circuit boards contain conductive paths that interconnect the integrated circuits. Cables and other communications paths are used to interconnect integrated circuits on different boards. Programmable logic devices contain transceiver circuitry for transmitting and receiving data over these communications paths.

Programmable logic device transceiver circuitry includes input and output drivers. The input and output drivers may use differential signaling schemes in which a pair of signals are referenced to each other or single-ended signaling schemes, in which signals are referenced to ground. In high-speed environments, the input and output drivers are generally differential drivers and handle differential signals.

In source-synchronous system architectures, multiple transmitters share a common clock. Each transmitter may transmit data signals and a clock signal to over a respective bus. A programmable logic device may receive and process the signals on each bus. With conventional transceiver arrangements, programmable logic devices use numerous phase-locked-loop circuits to receive and process the data transmitted over the buses.

It would be desirable to be able to provide integrated circuits such as programmable logic device integrated circuits with transceiver circuitry that handles source-synchronous transmissions while making efficient use of on-chip resources such as phase-locked-loop circuits.

SUMMARY

In accordance with the present invention, integrated circuits such as programmable logic device integrated circuits are provided with resource-efficient transceiver circuitry.

Receivers in the transceiver circuitry are used to receive data from multiple buses. Each bus has a reference clock signal and an associated set of data lines.

One of the reference clocks is provided to a phase-locked-loop circuit. The phase-locked-loop circuit generates a corresponding serial clock and parallel clock. The serial clock and parallel clock generated by the phase-locked-loop circuit are used to capture and deserialize data for one of the buses.

Each additional bus has an associated phase detector and delay locked loop in place of a phase-locked loop. The phase detector in each bus determines the phase shift between the reference clock in that bus and the reference clock provided to the phase-locked loop and generates a corresponding control signal. The control signal is used to shift the serial clock output of the phase-locked loop to produce an appropriate serial clock for the additional bus. A divider is used to produce a corresponding parallel clock for the additional bus.

This arrangement conserves circuit resources on integrated circuits with multiple data channels, because the use of a phase-locked-loop circuit in each channel is avoided.

Further features of the invention, its nature and various advantages will be more apparent from the accompanying drawings and the following detailed description of the preferred embodiments.

DETAILED DESCRIPTION

The present invention relates to integrated circuits containing receiver circuitry for receiving digital data transmitted over communications links. The integrated circuits use a receiver architecture that is efficient in its use of resource-intensive components such as phase-locked-loop circuits. As a result, digital data can be received and processed on a number of channels in parallel using a single phase-locked loop.

The integrated circuits used with the present invention may be any suitable type of integrated circuit. With one illustrative arrangement, the integrated circuits may be programmable logic device integrated circuits or programmable integrated circuits that contain programmable circuitry but that are not typically referred to as programmable logic devices. For example, the invention may be used with digital signal processing circuits containing programmable circuitry, microprocessors containing programmable circuitry, application specific integrated circuits containing programmable circuitry, or other suitable integrated circuits.

Figure 1:
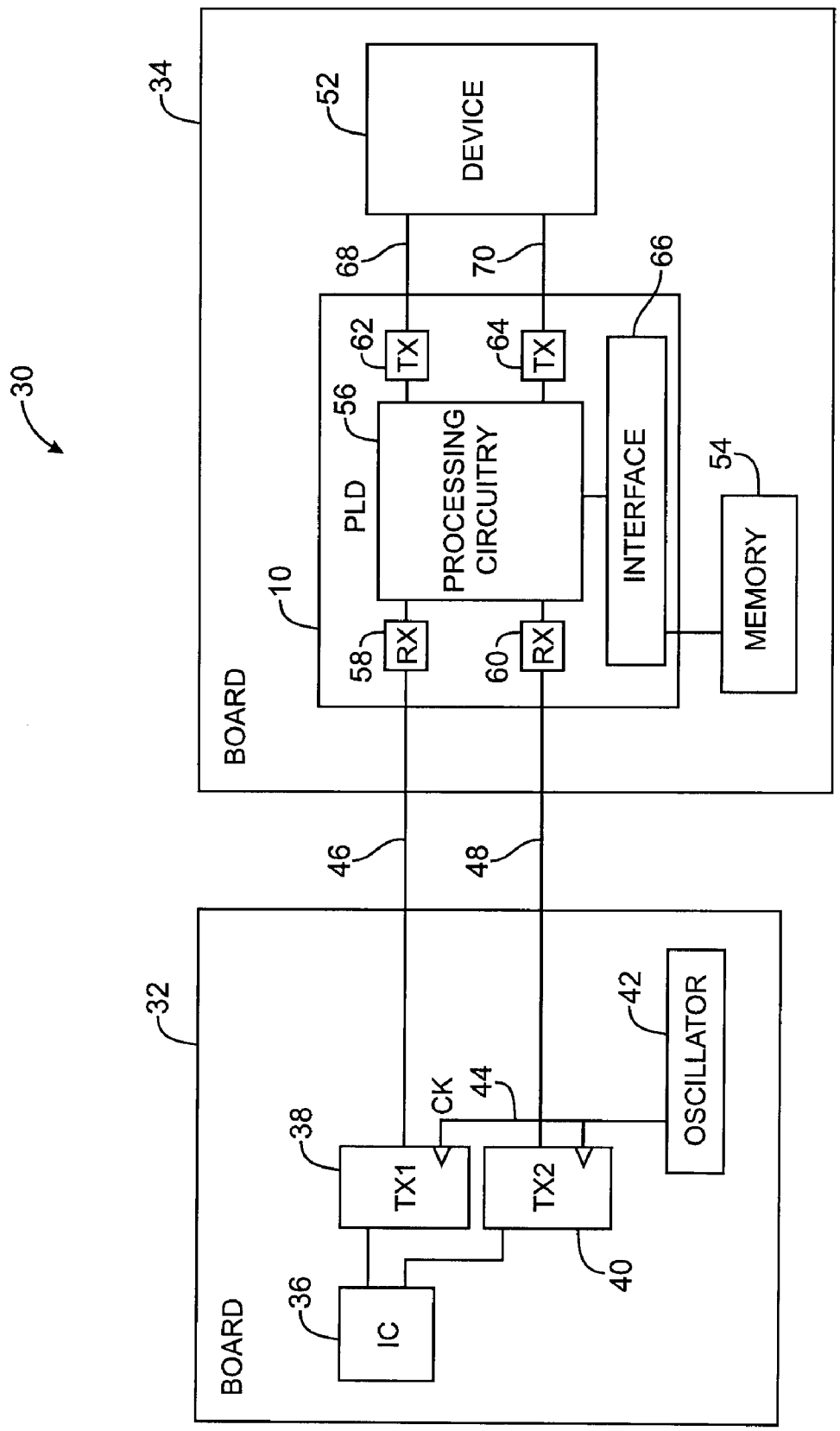
FIG. 1 is a diagram of an illustrative system in which a programmable logic device integrated circuit receives transmitted data over multiple buses in accordance with the present invention.

A typical system environment in which an integrated circuit with receiver circuitry in accordance with the present invention may be used is shown in FIG. 1. System 30 has two boards 32 and 34 that communicate over communications paths 46 and 48. Board 32 may be, for example, a board that generates visual information that is to be displayed on device 52 of board 34. Paths 46 and 48 may be formed using cables and conductive traces on boards such as boards 32 and 34.

One or more integrated circuits such as integrated circuit 36 generate data on board 32. The data is provided in digital form to transmitter circuits 38 and 40. The transmitters 38 and 40 are typically integrated circuit transmitters. In general, circuits 36, 38, and 40 may be implemented using any suitable number of integrated circuit chips. For example, circuits 36, 38, and 40 may be provided on a common die (i.e., as one chip).

The transmitters 38 and 40 may be clocked using a common clock signal CK. An oscillator 42 that is mounted on the board 32 may be used to generate the clock signal CK on path 44. Because both of the data sources (TX1 and TX2) are clocked using the same clock signal, this type of arrangement is sometimes referred to as a source synchronous scheme.

Paths 46 and 48 may use differential or signal-ended signaling schemes. In differential schemes, which are generally preferred for high-speed transmissions, each data stream is transmitted over a pair of differential signal wires that carry signals that are referenced to each other. In single-ended signaling schemes, data is referenced to ground.

Large amounts of data are typically conveyed using buses. With a typical source-synchronous bus arrangement, each bus carries a reference clock signal and a number of associated data signals. For example, a bus may carry a reference clock signal and four associated data signals. The data signals are nominally phase aligned with the reference clock. Due to skew that arises during transmission, it is necessary to capture and phase-align the data on each bus at the receiver using a clock signal derived from the reference clock for that bus.

With the arrangement shown in FIG. 1, paths 46 and 48 are buses that convey digital data to corresponding receivers 58 and 60 in programmable logic device integrated circuit 10. Programmable logic device integrated circuit 10 contains receiver circuitry 58 and 60. Receiver circuitry 58 receives data from transmitter 38 over bus 46 (bus1). Receiver circuitry 60 receives data from transmitter 40 over path 48 (bus2). The receivers 58 and 60 provide the data that has been received to processing circuitry 56.

Processing circuitry 56 may, in general, include any suitable circuitry for processing the received data. For example, processing circuitry 56 may include hardwired circuitry and programmable circuitry that has been configured by a user to implement a custom logic function. During its processing operations, the processing circuitry 56 may access memory 54 using memory interface 66. Memory 54 may be random-access memory, electrically-erasable programmable memory, or any other suitable memory.

Data that is produced by processing circuitry 56 may be conveyed to other integrated circuits and electrical components. In the example of FIG. 1, processing circuitry 56 conveys data to device 52 over paths 68 and 70. Paths 68 and 70 may be formed from circuit traces on board 34. Transmitter 62 may transmit data to device 52 over path 68. Transmitter 64 may transmit data to device 52 over path 70. Device 52 may include any suitable number of integrated circuits and hardware components. For example, device 52 may contain a monitor for displaying the visual information provided by integrated circuit 36. Paths 68 and 70 may be buses that convey multiple data and clock signals.

Any suitable signaling scheme may be used to transmit data over communications paths 46, 48, 68, and 70. For example, digital data may be transmitted using low voltage differential signaling (LVDS) techniques. With LVDS schemes, high-speed differential signals can be transmitted over pairs of signal lines. Differential input and output buffers in receiver circuitry 58 and 60 and transmitter circuitry 62 and 64 are used to convert between the differential signals that are used on paths 46, 48, 68, and 70 and the single-ended signals that are used in processing circuitry 56. Receiver circuitry 58 and 60 and/or transmitter circuitry 62 and 64 is sometimes referred to as transceiver circuitry.

Figure 2:
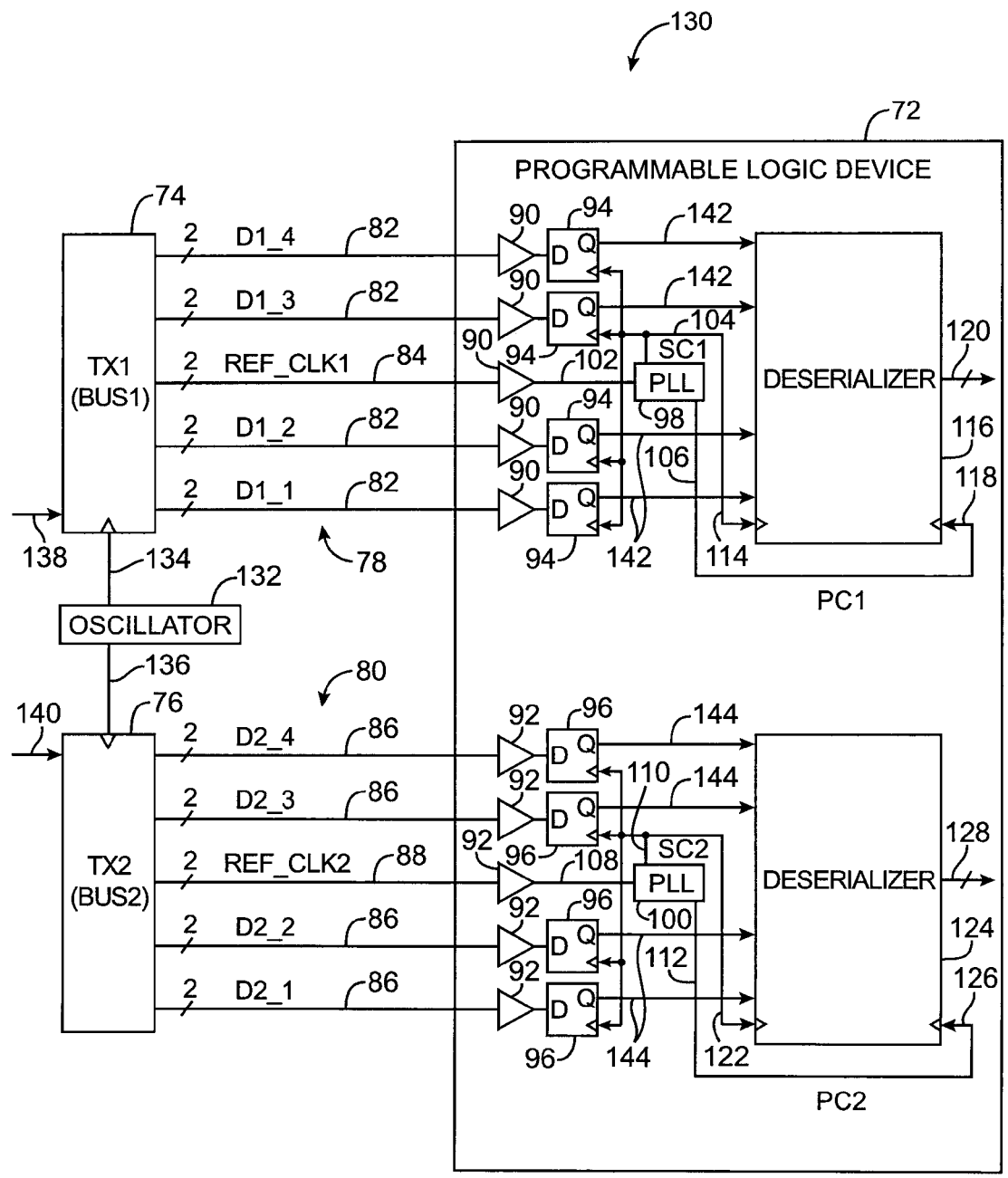
FIG. 2 is a diagram of a conventional transmitter and receiver arrangement for a programmable logic device integrated circuit in which a separate phase-locked-loop is used in each data channel.

A conventional source-synchronous system 130 containing a programmable logic device 72 is shown in FIG. 2. In system 130, transmitters 74 and 76 receive data from a data source via inputs 138 and 140, respectively. Transmitters 74 and 76 are driven by a common clock signal generated by oscillator 132. Transmitter 74 receives the clock signal from oscillator 132 via line 134. Transmitter 76 receives the same clock signal via line 136. Transmitters 74 and 76 transmit data over buses 78 and 80, respectively. Transmitter 74, which is associated with a first bus called bus1, transmits a reference clock REF_CLK1 on clock path 84 and transmits four associated data signals D1_1, D1_2, D1_3, and D1_4 on data paths 82. Transmitter 76, which is associated with a second bus called bus2, transmits a reference clock REF_CLK2 on clock path 88 and transmits four associated data signals D2_1, D2_2, D2_3, and D2_4 on data paths 86. Because transmitters 74 and 76 are provided with a common clock signal, the reference clocks that they generate (REF_CLK1 and REF_CLK2) are rate matched.

Due to variations in the bus paths 78 and 80 such as path length differences, the data signals in each bus become skewed. For example, in bus1, data signals D1_1, D1_2, D1_3, and D1_4 become skewed with respect to REF_CLK1 and each other. In bus2, signals D2_1, D2_2, D2_3, and D2_4 become phase shifted with respect to REF_CLK2 and each other. The signals REF_CLK1 and REF_CLK2 also fall out of phase alignment during their transmission over paths 78 and 80. The phase misalignment between buses 78 and 80 can be much larger than the skew within a given bus.

At the receiving end of the buses, phase-locked-loop circuitry on programmable logic device 72 is used to lock onto the reference clock signals. The phase-locked-loop circuitry generates clock signals that are used in receiving and deskewing the incoming data from the buses.

In conventional arrangements of the type shown in FIG. 2, a separate phase-locked-loop circuit is used for each bus, because the reference clock signals on the buses are out of phase with respect to each other (e.g., due to differences in the length of cabling used for bus paths 78 and 80).

As shown in FIG. 2, the data signals D1_1, D1_2, D1_3, and D1_4 and the reference clock signal REF_CLK1 for bus1 are received by input buffers 90 and the data signals D2_1, D2_2, D2_3, and D2_4 and the reference clock signal REF_CLK2 are received by input buffers 92. Buffers 90 and 92 each have two inputs for receiving a pair of differential clock or data signals. Buffers 90 and 92 also each have a single output at which a single-ended data or clock signal is provided.

The outputs of the data signal buffers 90 in bus1 are provided to data capture registers 94. The outputs of the data signal buffers 92 in bus2 are provided to data capture registers 96. Lines 142 are used to convey the outputs of registers 94 to the inputs of deserializer 116. Deserializer 124 receives output data from registers 96 via paths 144.

Deserializers 116 and 124 perform serial to parallel conversion. For example, the four inputs to each deserializer may be converted to a parallel data signal bus having 32 parallel lines. With this type of arrangement, deserializer 116 provides parallel data on 32 parallel lines 120 and deserializer 124 provides parallel data on 32 parallel lines 128. The data on lines 120 and 128 is conveyed to other circuitry on the programmable logic device 72 such as a user-implemented programmable logic circuit.

The reference clock on each bus is nominally edge aligned with the data signals. To properly capture data in registers 94 and 96, the phase-locked-loop circuits lock onto the reference clocks, multiply the frequency of each reference clock (e.g., by a factor of two), and impose a phase shift on the multiplied version of the reference clock so that the rising edge of the multiplied reference clock is aligned with the nominal midpoint of each of the data pulses arriving on the associated data lines. This clock signal is referred to as the "serial clock," because it is used to process serial data in the transceiver. Each phase-locked loop also creates a slower parallel clock, which is used to handle parallel data in the transceiver.

In bus1 of FIG. 2, phase-locked-loop circuit 98 receives the signal REF_CLK1 on input line 102 and generates two corresponding output signals. Phase-locked-loop circuit 98 generates serial clock SC1 on serial clock output line 104 and generates parallel clock signal PC1 on parallel clock output 106. The serial clock SC1 is conveyed to the clock inputs of registers 94 in bus1. The serial clock SC1 is also provided to the serial clock input 114 of deserializer 116. The parallel clock signal PC1 is conveyed to the parallel clock input 118 of deserializer 116.

In bus2, the signal REF_CLK2 is provided to phase-locked-loop circuit 100 via input driver 92 and input line 108. Phase-locked-loop circuit 100 receives the REF_CLK2 signal and generates two corresponding output signals. Phase-locked-loop circuit 100 generates serial clock SC2 on serial clock output line 110 and generates parallel clock signal PC2 on parallel clock output line 112. The serial clock SC2 is provided to the clock inputs of registers 96. The serial clock SC2 is also provided to the serial clock input 122 of deserializer 124. The parallel clock signal PC2 is provided to the parallel clock input 126 of deserializer 124.

In the example of FIG. 2, there are two data channels, each with its associated transmitter, bus, and receiver circuitry. Each data channel requires its own phase-locked-loop circuit. Phase-locked-loop circuits contain analog circuitry that consumes a relatively large amount of circuit resources. As a result, requiring each data channel to have its own phase-locked-loop circuit can be inefficient.

In accordance with the present invention, integrated circuits such as programmable logic device integrated circuits are provided that have resource-efficient receiver circuitry. The receiver circuitry of the present invention makes it possible to receive data from multiple data buses without providing a phase-locked-loop circuit for each bus.

Figure 3:
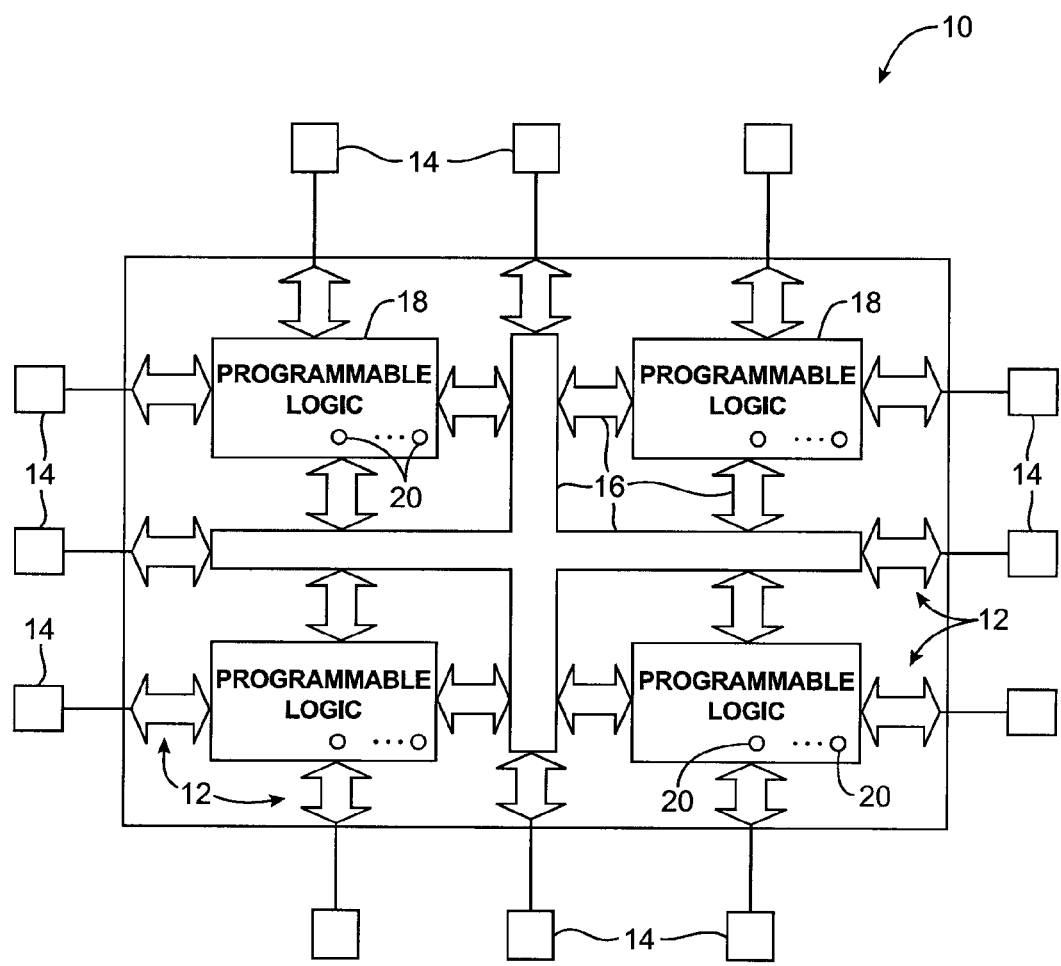
FIG. 3 is a diagram of an illustrative programmable logic device in accordance with the present invention.

An illustrative programmable logic device 10 in accordance with the present invention is shown in FIG. 3. Programmable logic device 10 may have input/output circuitry 12 for driving signals off of device 10 and for receiving signals from other devices via input/output pins 14. Interconnection resources 16 such as global and local vertical and horizontal conductive lines and buses may be used to route signals on device 10. Interconnection resources 16 include fixed interconnects (conductive lines) and programmable interconnects (i.e., programmable connections between respective fixed interconnects). Programmable logic 18 may include combinational and sequential logic circuitry. For example, programmable logic 18 may include look-up tables, registers, and multiplexers. The programmable logic 18 may be configured to perform a custom logic function. The programmable interconnects associated with interconnection resources may be considered to be a part of programmable logic 18.

Programmable logic devices contain programmable elements 20. Some programmable logic devices are programmed by configuring their programmable elements 20 using mask programming arrangements. A mask-programmed device is configured during semiconductor manufacturing. Other programmable logic devices are configured after semiconductor fabrication operations have been completed (e.g., using electrical programming or laser programming to program their programmable elements). In general, programmable elements 20 may be based on any suitable programmable technology, such as fuses, antifuses, electrically-programmable read-only-memory technology, random-access memory cells, mask-programmed elements, etc.

Many programmable logic devices are electrically programmed. With electrical programming arrangements, the programmable elements 20 may be formed from memory cells. During programming, configuration data is loaded into the memory cells 20 using pins 14 and input/output circuitry 12. Memory cells 20 are typically random-access-memory (RAM) cells. Because the RAM cells are loaded with configuration data, they are sometimes referred to as configuration RAM cells (CRAM).

After being loaded with configuration data (e.g., configuration data supplied from a configuration device), programmable elements 20 each provide a corresponding static control output signal that controls the state of an associated logic component in programmable logic 18. The output signals are typically applied to the gates of metal-oxide-semiconductor (MOS) transistors.

The circuitry of device 10 may be organized using any suitable architecture. As an example, the logic of programmable logic device 10 may be organized in a series of rows and columns of larger programmable logic regions each of which contains multiple smaller logic regions. The logic resources of device 10 may be interconnected by interconnection resources 16 such as associated vertical and horizontal conductors. These conductors may include global conductive lines that span substantially all of device 10, fractional lines such as half-lines or quarter lines that span part of device 10, staggered lines of a particular length (e.g., sufficient to interconnect several logic areas), smaller local lines, or any other suitable interconnection resource arrangement. If desired, the logic of device 10 may be arranged in more levels or layers in which multiple large regions are interconnected to form still larger portions of logic. Still other device arrangements may use logic that is not arranged in rows and columns.

Figure 4:
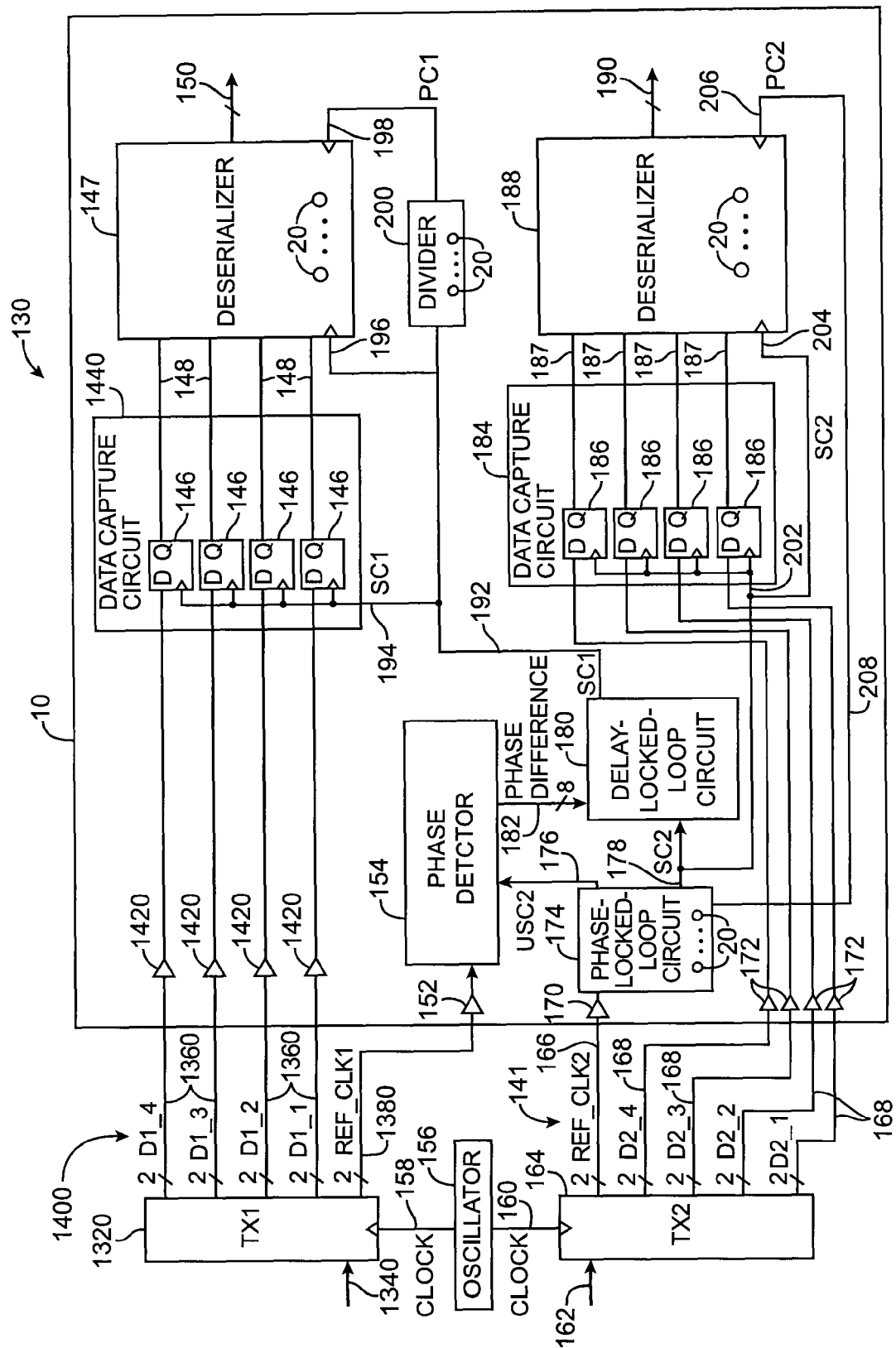
FIG. 4 is a diagram of a programmable logic device integrated circuit receiving data from two data buses using transceiver circuitry containing a single phase-locked-loop circuit in accordance with the present invention.

An illustrative system 130 that includes a programmable logic device integrated circuit 10 with receiver circuitry in accordance with the present invention is shown in FIG. 4. Programmable logic device 10 may be mounted on a board or other suitable mounting structure as described in connection with FIG. 1. Transmitters 1320 and 164 communicate with programmable logic device 10 over buses such as buses 1400 and 141. In a typical system, there may be numerous buses (e.g., 2-40 buses or more). A two-bus arrangement is shown in FIG. 4 as an example.

In source-synchronous schemes, transmitters 1320 and 164 are clocked using a common clock signal CLOCK. Each transmitter uses the signal CLOCK to generate a corresponding reference clock signal to transmit over an associated bus. A single oscillator 156 may generate the CLOCK signal, which is distributed to transmitters 1320 and 164 using paths 158 and 160.

One or more integrated circuits such as integrated circuit 36 of FIG. 1 generate data to be transmitted to programmable logic device 10. The data is provided to transmitters 1320 and 164 over data paths 1340 and 162. If desired, the logic circuitry that generates the data for paths 1340 and 162 may be integrated onto the same circuit or circuits as the circuitry of transmitters 1320 and 164. In some scenarios, transmitters 1320 and 164 are associated with separate integrated circuits. The signal CLOCK may be used as a reference clock input to the logic circuitry that generates the data for paths 1340 and 162.

Transmitter 1320 transmits data over a bus 1400 (i.e., a first bus called bus1). Transmitter 164 transmits data over a bus 141 (i.e., a second bus called bus2). The first and second buses each have their own separate reference clock. In bus1, data signals D1_1, D1_2, D1_3, and D1_4 on data lines 1360 are nominally edge-aligned with the reference clock signal REF_CLK1 on clock line 1380, whereas in bus2, data signals D2_1, D2_2, D2_3, and D2_4 on data lines 168 are nominally edge-aligned with the reference clock signal REF_CLK2 on clock line 166. Because the same oscillator 156 is used to clock both transmitter 1320 and transmitter 164, the signals REF_CLK1 and REF_CLK2 are rate matched. After transmission over buses 1400 and 141, however, the phases of signals REF_CLK1 and REF_CLK2 become mismatched in phase.

Rather than using a separate phase-locked-loop circuit in each bus to capture the associated reference clock and data, the architecture shown in FIG. 4 uses a single phase-locked-loop circuit 174. Phase-locked-loop circuit 174 is shared across both channels (i.e., bus1 and bus2), which saves circuit resources. In systems with more data channels, a phase-locked-loop circuit such as circuit 174 may be shared among more channels (e.g., 3-40 channels or more).

The data signals in each bus are provided to a corresponding data capture circuit.

In bus1, the differential data signals on lines 1360 are converted into single-ended signals using differential input drivers 1420. Data capture circuit 1440 uses registers 146 to capture the single-ended data from input drivers 1420. Each register 146 has a data input D, a data output Q, and a clock input. The data capture circuit 1440 phase-aligns the data signals D1_1, D1_2, D1_3, and D1_4 using registers 146 and provides the phase-aligned data to deserializer 147. The phase-aligned data is provided to deserializer 147 as four serial data streams over four paths 148.

In bus2, differential input drivers 172 convert the differential data signals on lines 168 into single-ended signals. Data capture circuit 184 uses registers 186 to capture the single-ended data from input drivers 172. Each register 186 has a data input D, a data output Q, and a clock input. The data capture circuit 184 phase-aligns the data signals D2_1, D2_2, D2_3, and D2_4 using registers 186 and provides four serial streams of phase-aligned data to deserializer 188 over four paths 187.

Deserializers 147 and 188 convert serial data into parallel data. Deserializer 147 is associated with the first data channel and handles data for bus1. Deserializer 188 is associated with the second data channel and handles data for bus2.

In bus1, clock divider 200 receives a serial clock SC1 for the first data channel on path 192 and divides this clock by a suitable integer N. With one suitable arrangement, the value of N is 8, so that the parallel clock signal PC1 at the output of divider 200 has a frequency that is one eighth of the frequency of SC1. The serial clock SC1 is provided to the serial clock input 196 of deserializer 147 while the parallel clock PC1 is provided to the parallel clock input 198 of deserializer 147.

During deserialization, each serial data stream on a single input line at the input of deserializer 147 is converted to a parallel signal on eight corresponding lines at the output 150 of deserializer 147. Because there are four serial inputs and because the serial-to-parallel conversion ratio is eight (in this example), there are 32 corresponding active lines on path 150. The parallel data on path 150 is provided to core logic on the programmable logic device (processing circuitry 56 of FIG. 1).

In bus2, phase-locked-loop circuit 174 generates a serial clock signal SC2 and a parallel clock signal PC2. The parallel clock PC2 is distributed to the parallel clock input 206 of deserializer 188 via path 208. The serial clock SC2 is provided to serial clock line 178 and is routed to the serial clock input 204 of deserializer 188. In general, the serial-to-parallel conversion ratio associated with the SC2 to PC2 clock frequency ratio can have any suitable value. With one suitable arrangement, the parallel clock PC2 has one eighth of the frequency of the serial clock SC2, so that deserializer 188 converts four lines 187 of serial data from data capture circuit 184 into 32 corresponding lines of parallel data on path 190. The parallel data on path 190 is routed to logic on device 10 (shown as processing circuitry 56 in FIG. 1).

The clock signals SC1, SC2, PC1, and PC2 are generated using a single phase-locked-loop circuit 174, a phase detector 154, and a delay-locked-loop circuit 180. In schemes involving more buses, a phase detector and delay-locked loop are associated with each additional bus.

The circuitry of FIG. 4 is preferably hardwired rather than being formed from programmable logic 18, because hardwired implementations consume fewer resources than circuit implementations based on programmable logic. The hardwired circuitry may, however, be adjusted using static control signals from programmable elements or using dynamic control signals from internal or external sources. With one illustrative arrangement, circuitry such as deserializers 147 and 188, divider 200, and phase-locked-loop circuitry 174 contains programmable elements 20 and can be configured during device programming (e.g., to adjust the serial-clock-to-parallel-clock ratio).

Figure 5:
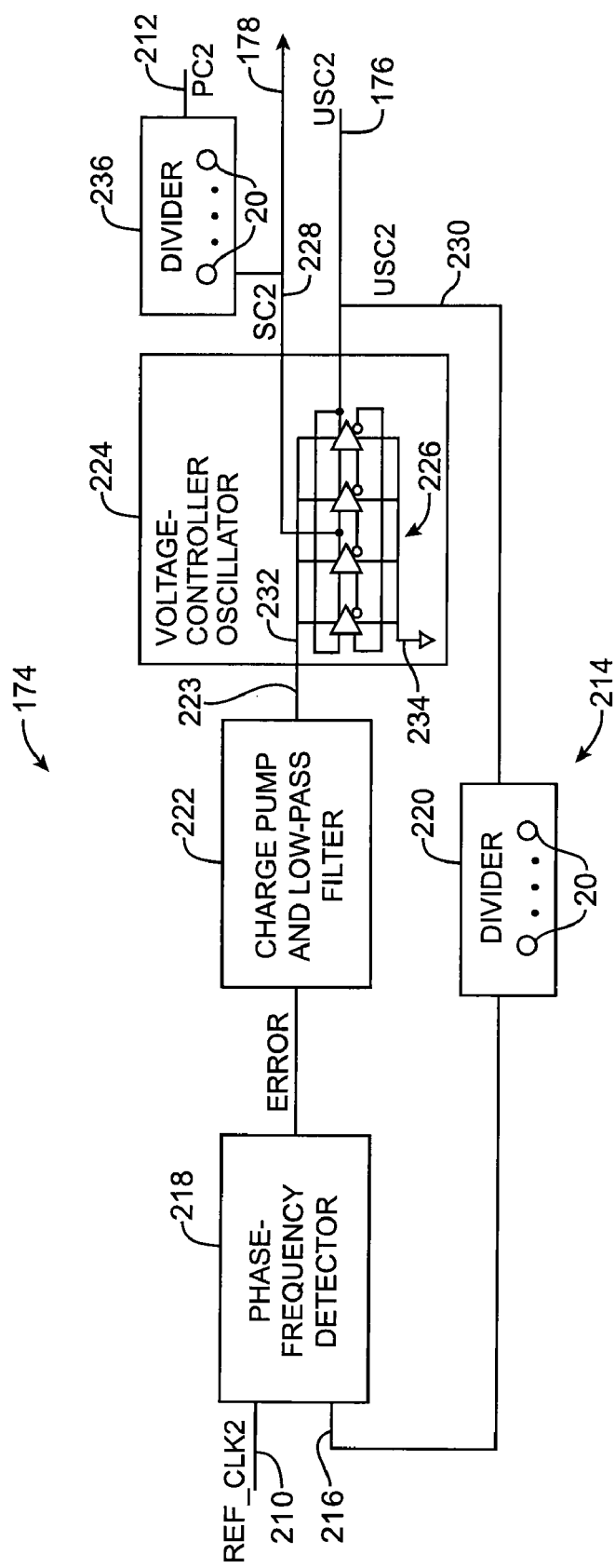
FIG. 5 is a diagram of an illustrative phase-locked-loop circuit in accordance with the present invention.

An illustrative phase-locked-loop circuit 174 is shown in FIG. 5. As shown in FIG. 5, phase-locked-loop circuit 174 has a phase-frequency detector 218 that receives the reference clock signal REF_CLK2 at input 210. The phase-frequency detector 218 also receives a feedback signal from feedback path 214 at input 216. The phase-frequency detector 218 compares the signals on lines 210 and 216 and generates a corresponding error control signal for charge pump and low pass filter 222. The error signal directs the charge pump circuitry 222 to generate a higher or lower voltage on its output line 223, as needed to lock the frequency of circuit 174 to its input.

Voltage-controlled oscillator 224 contains a ring of buffers 226. The buffers are powered using a positive power supply rail 232 that is connected to the output 223 of the charge pump 222 and a ground power supply rail 234. The frequency of the output of voltage controlled oscillator 224 is controlled by adjusting the voltage level on line 232.

The voltage-controlled oscillator 224 produces an unshifted serial clock signal USC2 at its output 176. Path 230 is used to feed back the signal USC2 from the voltage-controlled oscillator to divider 220. Divider 220 divides the signal USC2 by an appropriate integer (e.g., by two). Divider 220 preferably contains programmable elements 20, so that the integer setting of the divider can be adjusted during device programming.

The amount by which divider 220 divides signal USC2 determines the ratio between frequency of REF_CLK2 and serial clock signals SC2 and USC2. In a typical double-data-rate system, the serial clock signal SC2 has a frequency that is double the frequency of the reference clock (REF_CLK2). The frequencies of SC2 and USC2 are the same, but SC2 is obtained by using line 228 to tap into the oscillating loop in voltage controlled oscillator 224 at a different tap point than used to obtain signal USC2. As a result, the signal SC2 is shifted in phase by 90° with respect to USC2. This phase shift provides the signal SC2 with the proper phase alignment needed to clock the data signals associated with the second bus into the registers 186 of data capture circuit 184 (FIG. 4).

Divider 236 divides the serial clock signal SC2 on line 228 by an appropriate integer (e.g., 8) to produce the parallel clock signal PC2 on line 212. The divider 236 preferably contains programmable elements 20 and can be adjusted during the process of configuring programmable logic device integrated circuit 10. Line 178 is used to provide the serial clock signal SC2 to the input of delay-locked-loop circuit 180.

Figure 6:
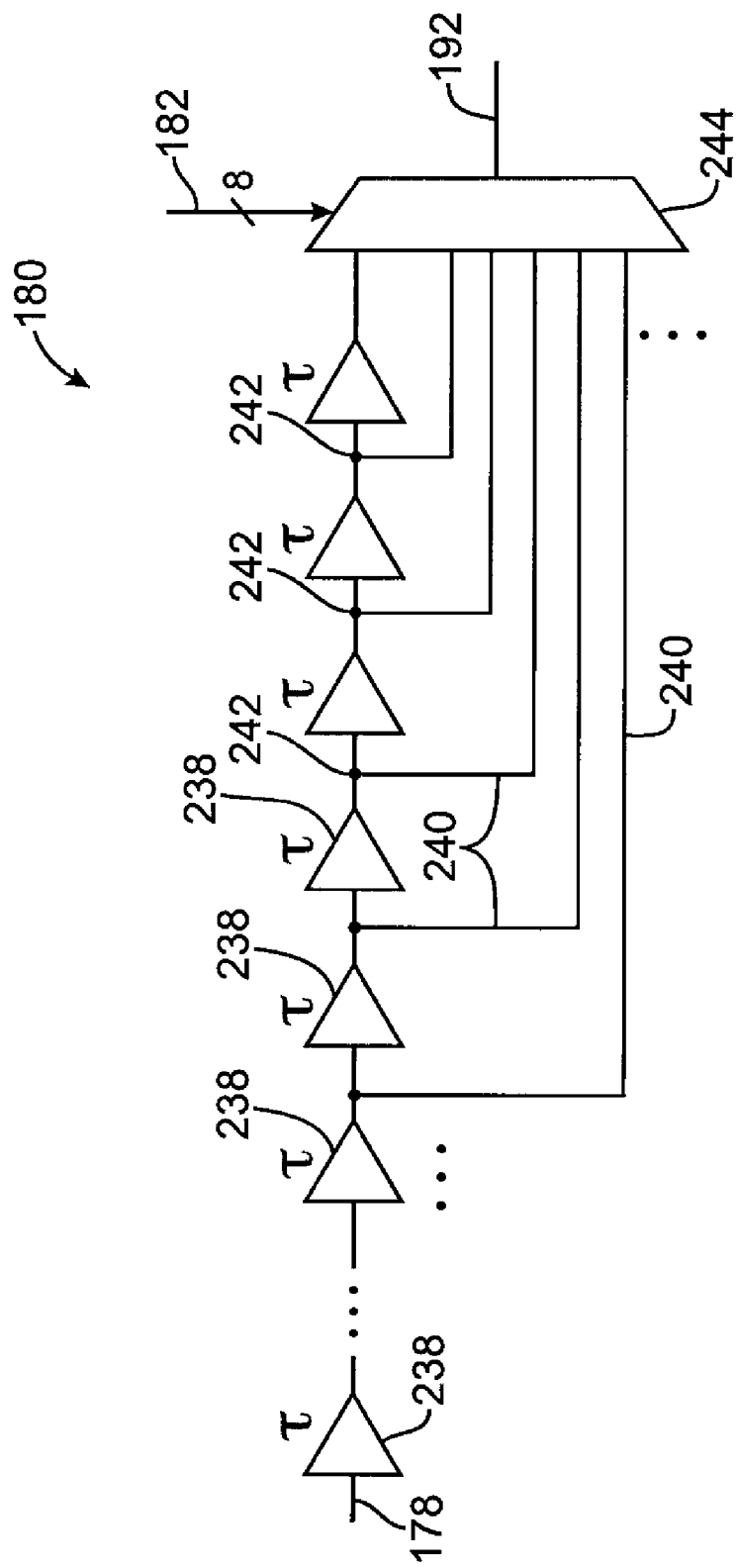
FIG. 6 is a diagram of an illustrative delay-locked-loop circuit controlled by an eight-bit control signal in accordance with the present invention.

A delay-locked-loop circuit 180 is shown in FIG. 6. Delay-locked-loop circuit 180 has an input 178 and an output 192. A chain of buffers 238 is used to create a controllable amount of delay for the signals passing between input 178 and output 192. Multiplexer 244 has multiple inputs and a single output. A control signal is applied to multiplexer 244 via control input 182. The control signal controls which of the multiplexer inputs is electrically connected to its output. The control signal may be provided in any suitable format. In the example of FIG. 6, the control signal is provided in the form of an eight-bit signal, providing eight bits of accuracy for adjusting the delay time of the delay-locked-loop circuit 180.

Paths 240 are connected to tap points 242 that lie between respective pairs of buffers 238. Each buffer has an associated delay time τ, so by controlling the location of the tap point 238, the delay of the circuit 180 can be adjusted. If, for example, multiplexer 244 is adjusted so that there are M buffers in the path between input 178 and output 192, the delay-locked-loop circuit 180 will generate a delay of Mτ.

Figure 7:
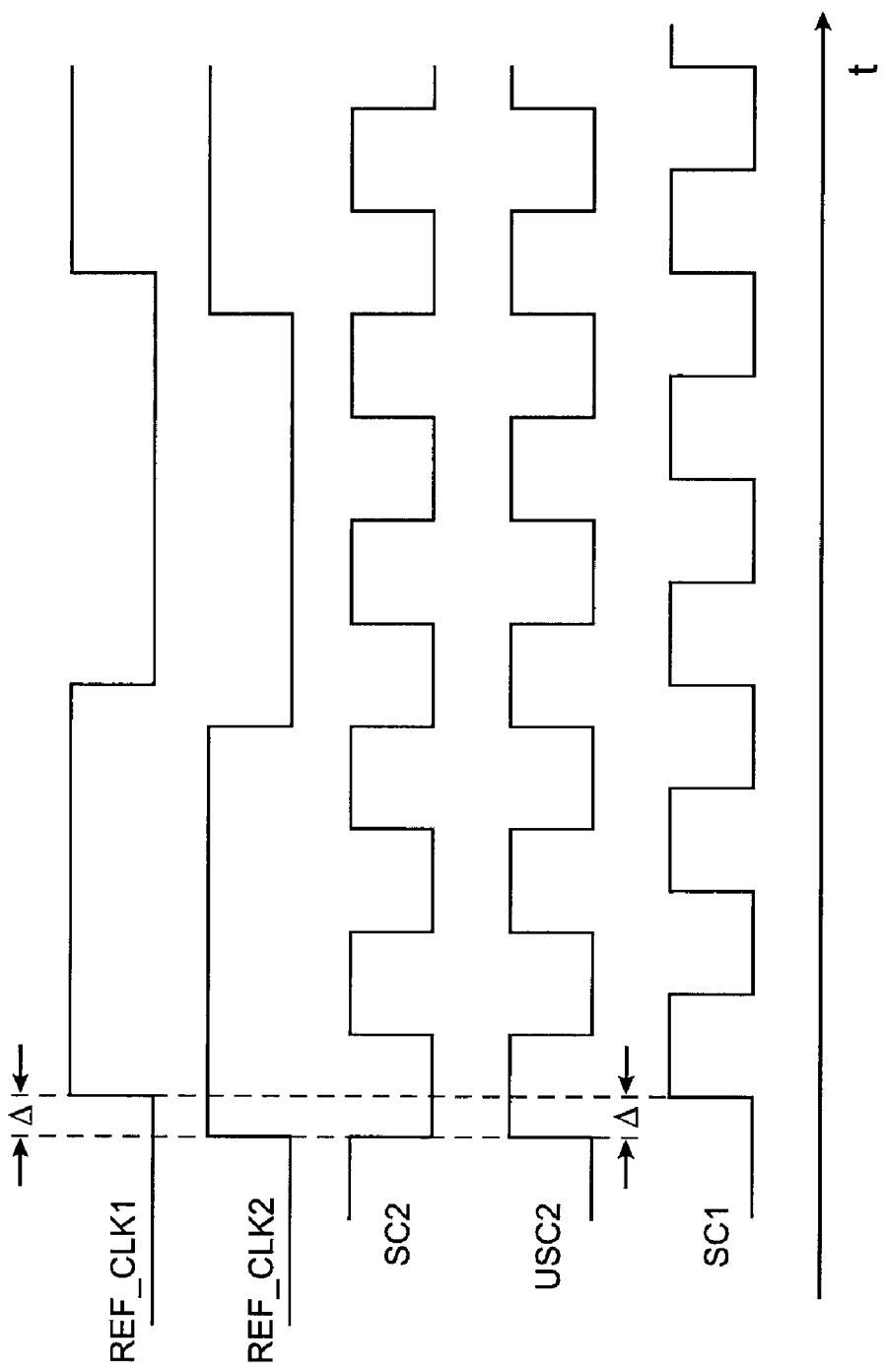
FIG. 7 is a diagram showing clock signals that are used by the transceiver circuitry of FIG. 4 in receiving and deserializing transmitted data in accordance with the present invention.

During operation of the receiver circuitry of programmable logic device 10 in system 130 of FIG. 4, the reference clock signals REF_CLK1 and REF_CLK2 are used to generate the signals SC1 and SC2. An illustrative situation is shown in FIG. 7. Differences between the cabling or other path differences between buses 1400 and 141 create a phase shift between their respective reference clocks. In the example of FIG. 7, the reference clock signal REF_CLK1 and REF_CLK2 are shifted by a time Δ with respect to each other. The signal REF_CLK2 is provided to the input of phase-locked-loop circuit 174 via input buffer 170. As described in connection with FIG. 5, the phase-locked-loop circuit 174 increases the frequency of the signal REF_CLK2 in accordance with the setting of divider 220. In the example of FIG. 7, the divider 220 has been set to divide the feedback signal on path 214 by two, so the serial clock SC2 has twice the frequency of signal REF_CLK2. This is a rate that is appropriate for receiving and processing incoming double-data rate signals on the data lines of bus1 and bus2.

The serial clock SC2 that is produced by the phase-locked-loop circuit 174 is provided to delay-locked-loop circuit 180 via path 178. The phase-locked-loop circuit 174 also produces the clock signal USC2 on output 176, as described in connection with FIG. 5. The signal USC2 has the same frequency as SC2, but has an inverted polarity. This ensures the signals USC2 and REF_CLK1 have rising edges that are separated by the same time Δ that separates the leading edges of the signals REF_CLK1 and REF_CLK2.

The phase detector 154 receives the signal REF_CLK1 from path 1380 via input buffer 152 and receives the signal USC2 via path 176. The phase detector compares the signals REF_CLK1 and USC2 to determine the time difference Δ. This time difference is indicative of the phase shift between the two reference clocks due to the path-length differences and other path differences between bus1 and bus2. Upon determining the value of Δ, the phase detector 154 generates a corresponding control signal PHASE DIFFERENCE on output line 182. The signal PHASE DIFFERENCE corresponds to the time difference Δ between and REF_CLK2 that is shown in the upper two traces of FIG. 7, because the signals USC2 and REF_CLK2 are phase aligned.

The signal PHASE DIFFERENCE is provided to delay-locked-loop circuit 180 over path 182. In response, the delay-locked-loop circuit 180 produces a corresponding amount of delay Δ for the input signal SC2 that is received from path 178. As shown in FIG. 7, the delay Δ that is applied to SC2 by the delay-locked-loop circuit 180 converts the signal SC2 into signal SC1 on path 192. Producing SC1 by shifting SC2, rather than by using a phase-locked-loop circuit, makes is possible to eliminate the phase-locked-loop circuit from bus1, thereby conserving resources.

In bus1, path 192 is used to distribute the serial clock SC1 to the clock input 194 of data capture circuit 1440 and to the serial clock input of deserializer 147. Divider 200 converts the serial clock signal SC1 into parallel clock signal PC1, which is routed to the parallel clock input of deserializer 147.

In bus2, path 178 is used to route the serial clock signal SC2 to the clock input 202 of data capture circuit 184 and to the serial clock input 204 of deserializer 188. The phase-locked-loop circuit 174 uses its divider 236 (FIG. 5) to produce parallel clock PC2 from serial clock SC2. The parallel clock PC2 is routed to parallel clock input 206 of deserializer 188 via path 208.

The foregoing is merely illustrative of the principles of this invention and various modifications can be made by those skilled in the art without departing from the scope and spirit of the invention.

What is claimed is:

1. An integrated circuit that receives data from a plurality of buses, each bus providing a reference clock and a set of associated data signals, the integrated circuit comprising:
    a plurality of data capture circuits;
    a plurality of phase detectors each of which produces a respective phase difference signal by comparing the reference clock for a respective one of the buses to a shared serial clock; and
    a plurality of delay-locked-loop circuits each of which receives the phase difference signal from a respective phase detector and produces a respective serial clock based on that phase difference signal and each of which applies its serial clock to a respective one of the data capture circuits.

2. The integrated circuit defined in claim 1 further comprising a phase-locked-loop circuit that produces the shared serial clock.

3. The integrated circuit defined in claim 1 further comprising a phase-locked-loop circuit that produces the shared serial clock at a first output, that receives a given reference clock at an input, and that phase shifts the given reference clock to produce a phase-shifted serial clock.

4. The integrated circuit defined in claim 1 wherein the delay-locked-loop circuits each have a first input that receives the phase difference signal, a second input, and an output at which its serial clock is provided, the integrated circuit further comprising:

a phase-locked-loop circuit that has a first output at which the shared serial clock is provided to the phase detectors and that has a second output with which a phase-shifted serial clock is provided to the second inputs of the delay-locked-loop circuits.

5. The integrated circuit defined in claim 1 further comprising a plurality of dividers, each divider receiving a respective one of the serial clocks from a respective one of the delay-locked-loop circuits and producing a corresponding parallel clock.

6. The integrated circuit defined in claim 1 further comprising:
  a plurality of deserializers; and
  a plurality of dividers, each divider receiving a respective one of the serial clocks and producing a corresponding parallel clock, wherein each deserializer has a serial clock input that receives a respective one of the serial clocks from a respective one of the delay-locked-loop circuits and a parallel clock input that receives the parallel clock from a respective one of the dividers.

7. The integrated circuit defined in claim 1 further comprising:
  a plurality of deserializers each associated with a respective one of the buses and having a set of serial data inputs that receive the set of associated data signals for that bus and having a set of parallel data outputs at which the data signals are provided after serial-to-parallel conversion; and
  a plurality of dividers, each divider receiving a respective one of the serial clocks and producing a corresponding parallel clock, wherein each deserializer has a serial clock input that receives a respective one of the serial clocks from a respective one of the delay-locked-loop circuits and a parallel clock input that receives the parallel clock from a respective one of the dividers.

8. The integrated circuit defined in claim 1 further comprising:
  a phase-locked-loop circuit that produces the shared serial clock at a first output, that produces a phase-shifted serial clock at a second output, and that receives a given reference clock signal at an input;
  a plurality of deserializers each associated with a respective one of the buses and having a set of serial data inputs that receive the set of associated data signals for that bus and having a set of parallel data outputs at which the data signals are provided after serial-to-parallel conversion; and
  a plurality of dividers, each divider receiving a respective one of the serial clocks from a respective one of the delay-locked-loop circuits and each producing a corresponding parallel clock, wherein each deserializer has a serial clock input that receives a respective one of the serial clocks from a respective one of the delay-locked-loop circuits and a parallel clock input that receives the parallel clock from a respective one of the dividers.

9. The integrated circuit defined in claim 1 further comprising:
  a plurality of deserializers each associated with a respective one of the buses and having a set of serial data inputs that receive the set of associated data signals for that bus and having a set of parallel data outputs at which the data signals are provided after serial-to-parallel conversion;
  a plurality of dividers, each divider receiving a respective one of the serial clocks from a respective one of the delay-locked-loop circuits and each producing a corresponding parallel clock, wherein each deserializer has a serial clock input that receives a respective one of the serial clocks from a respective one of the delay-locked-loop circuits and a parallel clock input that receives the parallel clock from a respective one of the dividers; and
  a phase-locked-loop circuit that produces the shared serial clock.

10. The integrated circuit defined in claim 1 wherein the delay-locked-loop circuits each have a first input that receives the phase difference signal, a second input, and an output at which its respective serial clock is provided, the integrated circuit further comprising:
  a plurality of deserializers each associated with a respective one of the buses and having a set of serial data inputs that receive the set of associated data signals for that bus and having a set of parallel data outputs at which the data signals are provided after serial-to-parallel conversion;
  a plurality of dividers, each divider receiving a respective one of the serial clocks from the output of a respective one of the delay-locked-loop circuits and producing a corresponding parallel clock, wherein each deserializer has a serial clock input that receives a respective one of the serial clocks from a respective one of the delay-locked-loop circuits and a parallel clock input that receives the parallel clock from a respective one of the dividers; and
  a phase-locked-loop circuit that has a first output at which the shared serial clock is provided to the phase detectors and that has a second output with which a phase-shifted serial clock is provided to the second inputs of the delay-locked-loop circuits.

11. The integrated circuit defined in claim 1 wherein the delay-locked-loop circuits each have a first input that receives the phase difference signal, a second input, and an output at which its serial clock is provided, the integrated circuit further comprising:
  a plurality of deserializers each associated with a respective one of the buses and having a set of serial data inputs that receive the set of associated data signals for that bus and having a set of parallel data outputs at which the data signals are provided after serial-to-parallel conversion;
  a plurality of dividers, each divider receiving a respective one of the serial clocks from the output of a respective one of the delay-locked-loop circuits and producing a corresponding parallel clock, wherein each deserializer has a serial clock input that receives a respective one of the serial clocks from a respective one of the delay-locked-loop circuits and a parallel clock input that receives the parallel clock from a respective one of the dividers; and
  an adjustable phase-locked-loop circuit that has a first output at which the shared serial clock is provided to the phase detectors, that has a second output with which a phase-shifted serial clock is provided to the second inputs of the delay-locked-loop circuits, and that contains a divider with programmable elements.

12. The integrated circuit defined in claim 1 wherein the delay-locked-loop circuits each have a first input that receives the phase difference signal, a second input, and an output at which its serial clock is provided, the integrated circuit further comprising:
  a plurality of deserializers each associated with a respective one of the buses and having a set of serial data inputs that receive the set of associated data signals for that bus and having a set of parallel data outputs at which the data signals are provided after serial-to-parallel conversion;
  a plurality of dividers, each divider receiving a respective one of the serial clocks from the output of a respective one of the delay-locked-loop circuits and producing a corresponding parallel clock, wherein each deserializer has a serial clock input that receives a respective one of the serial clocks from a respective one of the delay-locked-loop circuits and a parallel clock input that receives the parallel clock from a respective one of the dividers; and a phase-locked-loop circuit that has an input at which a given one of the reference clocks from a given one of the buses is received, wherein the shared serial clock and a phase-shifted serial clock are produced by the phase-locked-loop circuit based on the given one of the reference clocks, wherein the phase-locked-loop circuit has a first output at which the shared serial clock is provided to the phase detectors, and wherein the phase-locked-loop circuit has a second output with which the phase-shifted serial clock is provided to the second inputs of the delay-locked-loop circuits.

13. The integrated circuit defined in claim 1, wherein the delay-locked-loop circuits each have a first input that receives the phase difference signal, a second input, and an output at which its serial clock is provided to a respective one of the data capture circuits and wherein each data capture circuit is associated with a respective one of the buses and comprises a plurality of data capture registers that receive the serial clock from the output of the delay-locked-loop circuit associated with that bus and that receive the set of data signals associated with that bus, the integrated circuit further comprising:

a plurality of deserializers, each associated with a respective one of the buses, each having a set of serial data inputs that receive the set of associated data signals for that bus from the plurality of data capture registers in the data capture circuit associated with that bus, and each having a set of parallel data outputs at which the data signals are provided after serial-to-parallel conversion;

a plurality of dividers, each divider receiving a respective one of the serial clocks from the output of a respective one of the delay-locked-loop circuits and producing a corresponding parallel clock, wherein each deserializer has a serial clock input that receives a respective one of the serial clocks from a respective one of the delay-locked-loop circuits and a parallel clock input that receives the parallel clock from a respective one of the dividers; and a phase-locked-loop circuit that has an input at which a given one of the reference clocks from a given one of the buses is received, wherein the shared serial clock and a phase-shifted serial clock are produced by the phase-locked-loop circuit based on the given one of the reference clocks, wherein the phase-locked-loop circuit has a first output at which the shared serial clock is provided to the phase detectors, and wherein the phase-locked-loop circuit has a second output with which the phase-shifted serial clock is provided to the second inputs of the delay-locked-loop circuits.

14. The integrated circuit defined in claim 1 further comprising a phase-locked-loop circuit that receives the reference clock associated with a given one of the buses and produces the shared serial clock based on the received reference clock, wherein the phase-locked-loop circuit comprises:

a phase-frequency detector that receives a feedback signal at one input and that receives the reference clock from the given one of the buses at another input;

a charge pump that receives output signals from the phase-frequency detector;

a voltage-controlled oscillator that receives signals from the charge pump and that produces an output signal;

a divider that divides the output signal from the voltage-controlled oscillator by an integer; and a feedback path that provides the divided output signal from the divider to the phase-frequency detector as the feedback signal.

15. The integrated circuit defined in claim 1, wherein the integrated circuit comprises a programmable logic device containing programmable random-access-memory cells, the integrated circuit further comprising a phase-locked-loop circuit that receives the reference clock associated with a given one of the buses and produces the shared serial clock based on the received reference clock, wherein the phase-locked-loop circuit comprises:

a phase-frequency detector that receives a feedback signal at one input and that receives the reference clock from the given one of the buses at another input;

a charge pump that receives output signals from the phase-frequency detector;

a voltage-controlled oscillator that receives signals from the charge pump and that produces an output signal;

a divider that contains a set of the programmable random-access-memory cells and that divides the output signal from the voltage-controlled oscillator by an integer amount that is controlled by configuration data loaded into the set of programmable random-access-memory cells; and a feedback path that provides the divided output signal from the divider to the phase-frequency detector as the feedback signal.

16. A programmable logic device integrated circuit that receives data and reference clock signals from a plurality of transmitters that are not located on the integrated circuit over a plurality of buses, wherein there are a plurality of data lines and a reference clock line associated with each bus, the programmable logic device integrated circuit comprising:

a plurality of data capture circuits, each of which is associated with a respective one of the buses and each of which has a plurality of data capture registers that capture data signals associated with that bus, wherein the data capture registers have clock inputs;

a phase-locked-loop circuit that receives a reference clock signal from the reference clock line in one of the buses and that produces corresponding first and second serial clock signals;

a plurality of phase detectors, wherein each phase detector is associated with a respective one of the buses and receives a reference clock signal from the reference clock line in that bus, wherein each phase detector receives the first serial clock signal from the phase-locked-loop circuit, and wherein each phase detector produces a corresponding phase difference signal; and a plurality of delay-locked-loop circuits, wherein each delay-locked-loop circuit is associated with a respective one of the buses and receives the phase difference signal from the phase detector for that bus and receives the second serial clock signal from the phase-locked-loop circuit, wherein each delay-locked-loop circuit produces a corresponding serial clock signal and applies its serial clock signal to the clock inputs of the data capture registers that are capturing the data signals for the respective bus.

17. The programmable logic device integrated circuit defined in claim 16 further comprising:

a plurality of deserializers; and a plurality of dividers, each divider receiving a respective one of the serial clock signals from a respective one of the delay-locked-loop circuits and producing a corresponding parallel clock, wherein each deserializer has a serial clock input that receives a respective one of the serial clock signals from a respective one of the delay-locked-loop circuits and a parallel clock input that receives the parallel clock from a respective one of the dividers.

18. The programmable logic device integrated circuit defined in claim 16 further comprising a plurality of dividers, each divider receiving a respective one of the serial clock signals from a respective one of the delay-locked-loop circuits and producing a corresponding parallel clock.

19. The programmable logic device integrated circuit defined in claim 16 wherein the phase-locked-loop circuit comprises:
- a phase-frequency detector that receives a feedback signal at one input and that receives the reference clock signal at another input;
- a charge pump that receives output signals from the phase-frequency detector;
- a voltage-controlled oscillator that receives signals from the charge pump and that produces an output signal;
- a divider that divides the output signal from the voltage-controlled oscillator by an integer; and
- a feedback path that provides the divided output signal from the divider to the phase-frequency detector as the feedback signal.

20. The programmable logic device integrated circuit defined in claim 16 wherein the phase-locked-loop circuit comprises:
- a phase-frequency detector that receives a feedback signal at one input and that receives the reference clock signal at another input;
- a charge pump that receives output signals from the phase-frequency detector;
- a voltage-controlled oscillator that has an input that receives signals from the charge pump, that has a first output at which the first serial clock signal is provided, and that has a second output at which the second serial clock signal is provided, wherein the first and second serial clock signals are phase-shifted with respect to each other;
- a divider that divides the first serial clock signal from the voltage-controlled oscillator by an integer; and
- a feedback path the provides the divided output signal from the divider to the phase-frequency detector as the feedback signal.

* * * * *